United States Patent
Melman

[11] Patent Number: 6,134,393
[45] Date of Patent: Oct. 17, 2000

[54] IMAGING DEVICE FOR STANDARD CAMERA BODIES

[75] Inventor: Haim Zvi Melman, Kfar Saba, Israel

[73] Assignee: Scitex Corporation Ltd., Herzlia, Israel

[21] Appl. No.: 08/925,343

[22] Filed: Sep. 8, 1997

[30] Foreign Application Priority Data

Sep. 9, 1996 [IL] Israel ........................................ 119227

[51] Int. Cl.[7] .................................................. G03B 17/24
[52] U.S. Cl. ............................................. 396/429; 348/64
[58] Field of Search ...................................... 396/429, 374, 396/439, 535, 536, 538; 257/621; 348/64

[56] References Cited

U.S. PATENT DOCUMENTS

| | | |
|---|---|---|
| 3,462,650 | 8/1969 | Hennings et al. ...................... 357/621 |
| 3,622,419 | 11/1971 | Tempe et al. . |
| 3,836,393 | 9/1974 | Ernsthausen et al. . |
| 3,919,452 | 11/1975 | Ettre et al. . |
| 3,957,537 | 5/1976 | Baskett et al. . |
| 4,184,903 | 1/1980 | Dillard et al. . |
| 4,999,484 | 3/1991 | Kaneko . |
| 5,282,040 | 1/1994 | Sapir ....................................... 396/429 |
| 5,343,071 | 8/1994 | Kazior et al. ........................... 257/621 |
| 5,433,911 | 7/1995 | Ozimek et al. ......................... 264/261 |
| 5,483,284 | 1/1996 | Ishiguro . |
| 5,528,080 | 6/1996 | Goldstein ................................ 257/621 |
| 5,561,458 | 10/1996 | Cronin et al. ........................... 396/429 |

OTHER PUBLICATIONS

E. Bassous et al. Applied Physics Letters, 31:135–137, 1977.

*Primary Examiner*—David M. Gray
*Attorney, Agent, or Firm*—Darby & Darby

[57] ABSTRACT

An imaging device for fitting to a standard camera body is provided. The device includes an imaging die mounted on a support element and a glass cover attached to the upper surface of the die. The imaging device is located along the optical axis of the camera body.

1 Claim, 7 Drawing Sheets

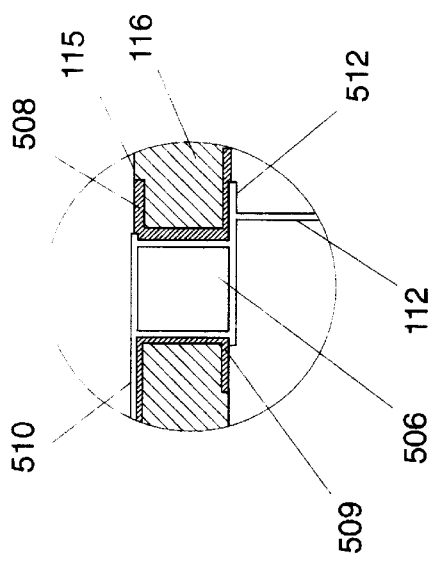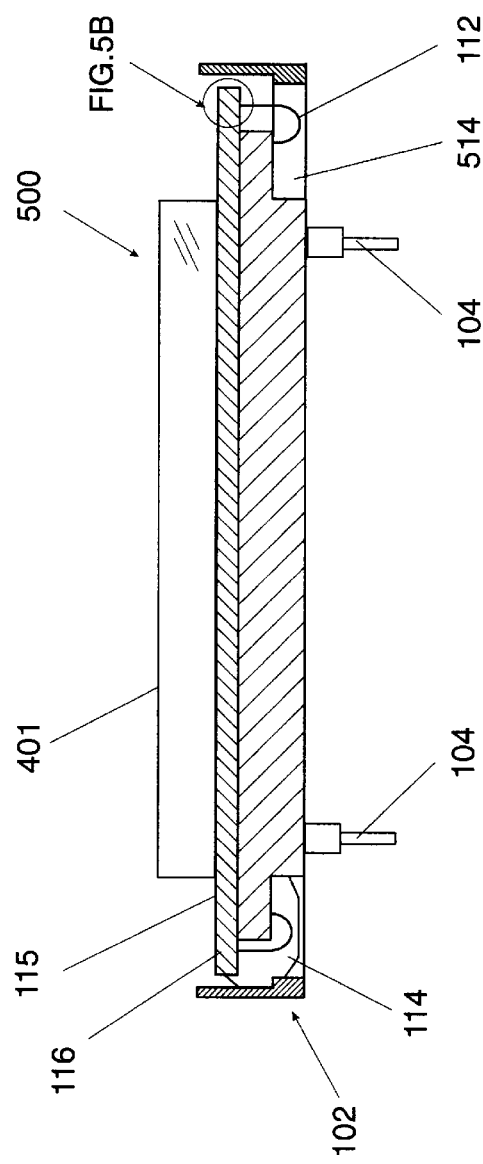

IMAGING DEVICE FOR STANDARD CAMERA BODIES

FIELD OF THE INVENTION

The present invention is related to digital photography and particularly 5 to 35 mm digital photography cameras.

BACKGROUND OF THE INVENTION

One of the most important technologies in digital photography is the implementation of two dimensional imaging devices such as CCDs (Charge Couple Device) in the body Of standard camera format.

It is desired that the imaging device will function as a complete substitute for photographic film. This should provide imaging area of the same size as the film exposed area and geometry that enables the placement of the imaging device sensitive area at the film focal plan.

The imaging device is thick relative to standard photography film and is larger in size than it's imaging area. These geometrical restrictions generate conflicts with standard cameras bodies and therefore the imaging device is unsuitable as a complete substitution for a film.

Present art of digital cameras provide, three methods for the implementation of a imaging device in a body of standard formats.

The first solution involves building a camera body specially designed for accommodating a imaging device in the image plan. This solution is not suitable for use with the large selection of commercially available camera bodies. It is limited to camera bodies specially designed and manufactured for the specific imaging device Such a solution is provided in StudioCam, from Agfa-Gevaert, Germany.

In a second solution, an imaging device is supplied which is smaller than the standard film format and is implemented in camera bodies which do not have a focal-plane shutter. This solution enables the implementation of the imaging device in commercially available camera bodies but many such cameras with a focal plane shutter may introduce serious mechanical difficulties Furthermore, it is inconvenient for the photographer owing to the smaller imaging format. An example of a camera based on this solution is the CatchLight from Leaf Systems, Inc., Bedford, USA In the third method, an optical relay is used to transfer the image from the focal plane of the camera to the focal plane of the imaging device. Usually, magnification is used to provide an effective format which is the same as the film format. Such a solution is provided in model Fujix DS-5051DS-515 by Fuji Photo Film Co., Ltd. of Japan. The drawbacks of this solution are costly optical relay, added weight of the optical relay and reduction of optical performance (sharpness and vignetting).

SUMMARY OF THE INVENTION

It is the objective of the present invention to provide an imaging device having the format of 35 mm film which can be mounted directly in the focal plane of a commercially available 35 mm camera body, while avoiding the interaction with the camera's focal-plane shutter.

The glass cover of the imaging device is glued directly to the imaging surface of the imaging device. This reduces the thickness of the imaging device front end and thus, prevents interaction with the focal plane shutter. The upper and lower side edges of the glass cover are formed to a shape that enables the mounting of the imaging device onto the film support leads of the camera.

In one preferred embodiment of the invention, the thickness of the glass cover and the side edges are designed in such a way that the imaging die plane is positioned behind the focal plane of the camera lens, the thickness of the glass cover compensating for this displacement. This allows space for the electrical leads connecting the semi-conducting chip (die) to the electrical contacts.

In another embodiment of the invention, the die is placed on the film leads. In the example shown, holes are drilled in the wafer to enable the electrical contacts an the back or rear surface of the die to be connected to the front surface.

There is thus provided, in accordance with a preferred embodiment of the invention, an, imaging device for fitting to a standard camera body. The device includes an imaging die mounted on a support element, a glass cover attached to the upper surface of the die . The imaging device is located along the optical axis of said camera body.

Furthermore, in accordance with a preferred embodiment of the invention, the support element includes a box-like structure having a pair of leading edges extending along the length of two parallel sides of the box like structure. The leading edges are used to determine the position of the imaging device along the optical axis of the camera body.

Alternatively, in accordance with a preferred embodiment of the invention, the support element includes an open box-like structure having a base and sides extending perpendicularly from the base. The non-connected edges of the sides are used to determine the location of the imaging device along the optical axis of the camera body.

Furthermore, in accordance with a preferred embodiment of the invention, the die has an imaging surface surrounded by a perimetric non-imaging area and the die is glued to the glass cover along the perimeter.

Furthermore, in accordance with a preferred embodiment of the invention, the imaging die is connected to an power source by means of electrical contacts covered by protective material. Additionally, the imaging die has a generally rectangular shape, an upper and lower surface, and the electrical contacts are connected to at least two opposite sides of the die. The electrical contacts, which are located on the rear side of the die, are connected to the upper surface of the imaging die.

In addition, in accordance with a preferred embodiment of the invention, the imaging die includes a hole formed through the imaging die, an electrical isolating layer coated on the upper and lower surfaces and the inside faces of the hole, and an electrical conductive layer attached to the isolating layer to form a bonding pad for the electrical contacts.

In addition, there is also provided, in accordance with a preferred embodiment of the invention, a camera which includes a camera body and an imaging device fitted to the camera body.

Finally, there is also provided, in accordance with a preferred embodiment of the invention, a method for providing electrical contacts to the upper surface of a semi-conductor die having an upper and lower surface, the electrical contacts being located on the rear side of the die. The method includes the steps of:

a) forming a hole in the semi conducting die, and:

b) coating an electrical isolating layer on the upper and lower surfaces and the inside faces of the hole; and c) attaching an electrical conductive layer to the isolating layer to form a bonding pad for the electrical contacts.

BRIEF DESCRIPTION OF THE DRAWINGS

The present invention will be understood and appreciated more fully from the following detailed description taken in conjunction with the appended drawings in which:

FIGS. 5A and 5B are cross sectional views of a imaging device constructed and operative in accordance with a further preferred embodiment of the invention;

DETAILED DESCRIPTION OF THE INVENTION

The description hereinbelow is made in reference to 35 mm photographic systems. This is made by a way of example and it does not limit the scope of the invention.

Figure 1:
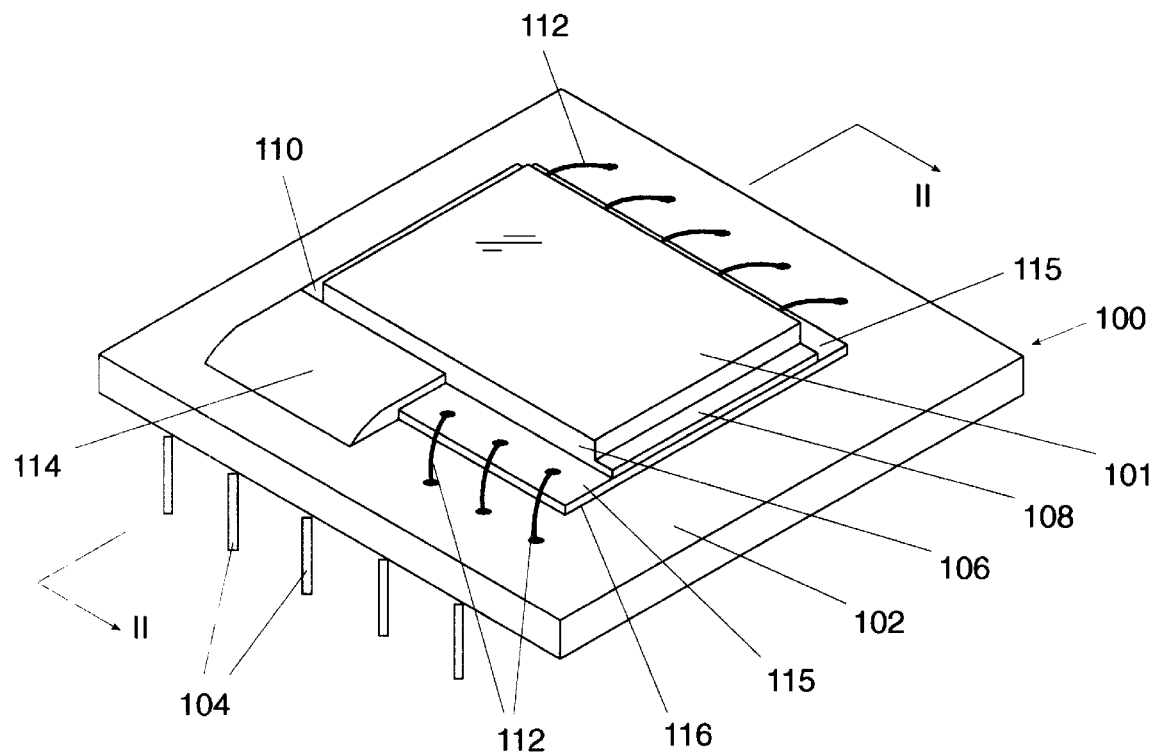
FIG. 1 is a general schematic view of an imaging device, constructed and operative in accordance with a preferred embodiment of the invention.

Reference is made to FIG. 1, which is a general schematic view of an imaging device, generally designated 100, in accordance with a preferred embodiment of the invention.

Imaging device 100 comprises a glass cover 106, having two leading edges, referenced 108 and 110, which are glued directly to the upper surface 115 of a semiconductor die 116. The two leading edges, referenced 108 and 110, are parallel to the longer (36 mm) side of the die 116. Any suitable glue, such as glues used for gluing doublets in optical systems may be used. Glass cover 106 is generally concentric with the sensitive area, referenced 101, of die 116.

The imaging device sensitive area 101 of the imaging device 100, is configured to match the size of a standard 35 mm format, that is 24 mm×36 mm. The glass cover 106 is approximately 35 mm long (along edge 108) and approximately 24 mm wide. Thus, glass cover 106 can be fitted into the opening of standard 35 mm camera bodies. The imaging device sensitive area 101 is centrally positioned on, the surface 115 of the imaging device die 116. The die 116 is mounted on to a supporting element, referenced 102. Support element 102 may comprise any suitable shape and is shown in FIG. 1, for the purposes of example only and without being in any way limiting to the invention, as having a generally rectangular configuration.

Pins 104 connect the die 116 of the imaging device 100 to an electrical circuit board (not shown) for operating the imaging device 100. Connecting wires 112 provide the electrical contact from the device 100 to the pins 104.

A protective layer 114 is provided to cover and protect wires 112 from mechanical damage. The height of layer 114 is generally limited to the height of edges 108 and 110. In FIG. 1, only a part of the protective layer 114 is shown to provide a view of the connecting wires 112. Layer 114 is made from electrically insulating epoxy glue or any other suitable material, known in the art.

Leading edges 108 and 110 are used to position the imaging device 100 on to the film leads in the 35 mm camera body. Leading edges 108 and 110 are located at the focal plane of the camera. The total thickness of glass cover 106 together with the edges 108 and 110 provide a shift in the effective focal plane so that the effective focal plane will coincident with the sensitive surface area 101 of die 116. An example of a suitable glass cover is the material known as BK7, which has an index of refraction of approximately 1.5. The change in the focal plane is approximately ⅓ of the thickness of the glass cover. Thus, the thickness of edges 108 and 110 are, approximately ⅓ of the total thickness of glass cover 106.

In the preferred embodiment of FIG. 1, the wires 112 connecting the semiconductor die 116 to the supporting element 102 are located beside the shorter (24 mm) edges of the device since the glass cover 106 covers the full length (36 mm) of the leading edges 108 and 110.

Figure 2:
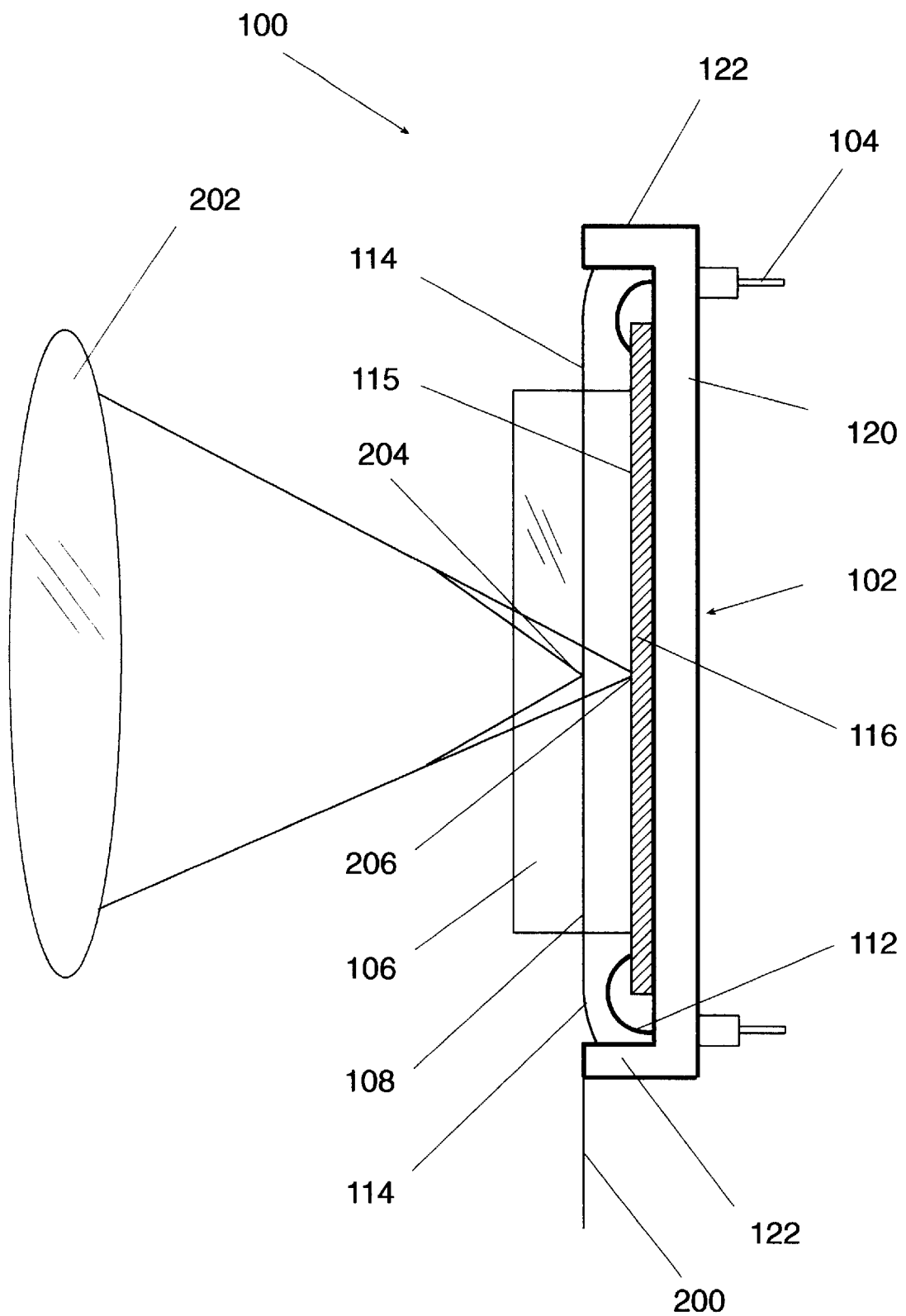
FIG. 2 is a detailed cross-sectional view of the imaging device of FIG. 1, taken along lines II—II.

Reference is made now to FIG. 2, which is a detailed cross-sectional view of the imaging device 100 of FIG. 1. Glass cover 106 is not shown cross-sectioned, for clarity. Also shown in FIG. 2 is the camera lens 202.

Support element 102 is shown in FIG. 2, for the purposes of example only, as having an open box-like shape, having a base 120 and open sides 122 extending perpendicularly from base 120. The open box-like shape provides additional protection to the imaging device 100 and connecting wires 112. The sides 122 of the support element 102 are limited in height so as not to extend above the focal plane, referenced 200 of the camera body, that is sides 122 are the same height as the leading edges 108 and, 110 of the glass cover 106.

Protective layer 114, such as any epoxy glue, fills the space between the sides of support element 102 and the glass cover 106. The wires 112 and the edges of the semiconductor die 116 are protected from mechanical damage by protective layer 114.

Lens 202, which is designed to image an object onto the focal plane 200 of the camera's film, has a focal point, referenced 204. Due to the presence of glass cover 106, the focal point is shifted to a position, referenced 206.

Figure 3:
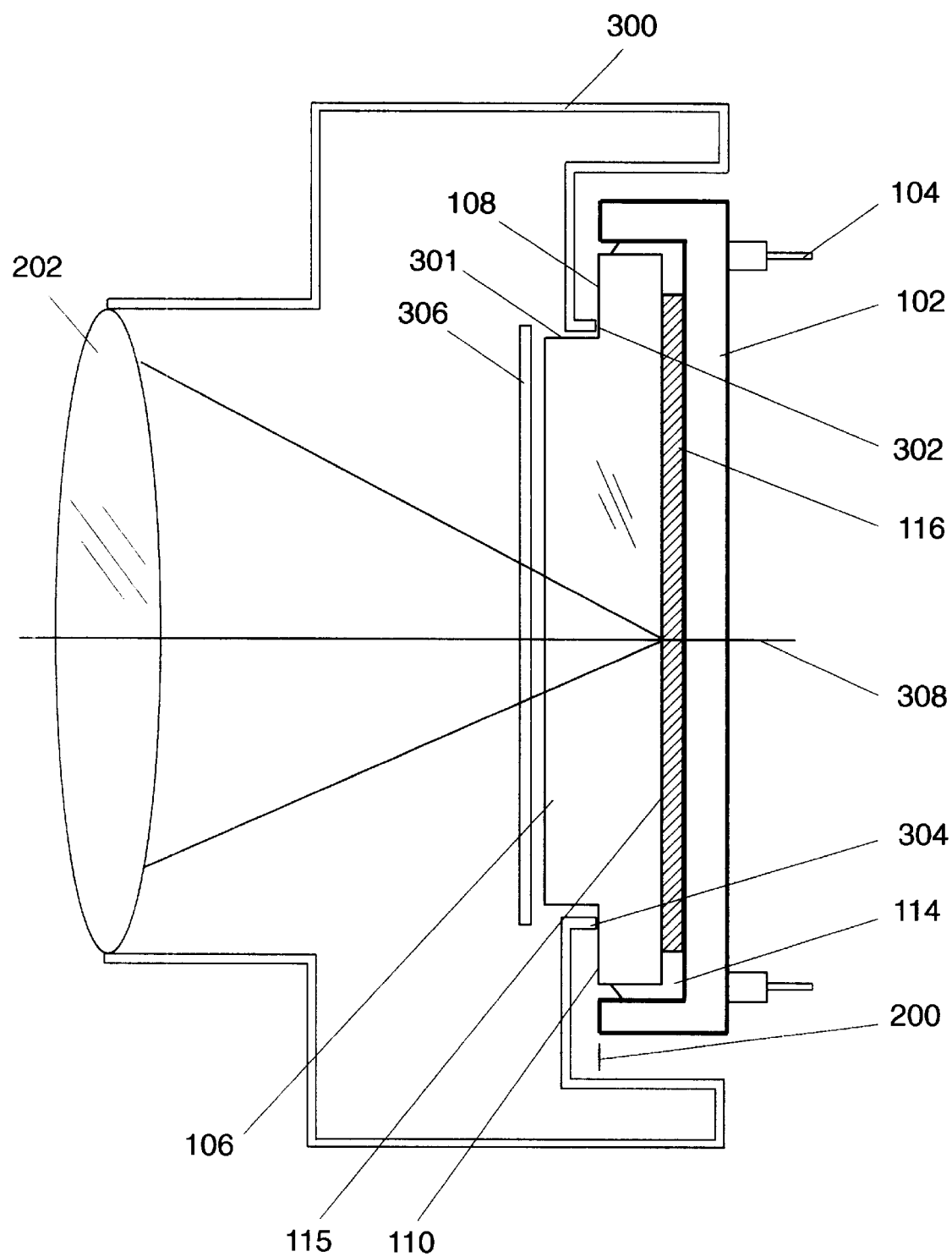
FIG. 3 is a cross-sectional view of the imaging device of FIG. 1 attached to a camera body.

Reference is made now to FIG. 3, which is a cross-sectional view of the CCD imaging device 100 of FIG. 1, perpendicular to the view II—II, shown in FIG. 2 The imaging device 100 is shown mounted onto a 35 mm camera body, generally designated 300.

Camera body has an optical axis, indicated by line 308 and comprises a focal-plane shutter 306 and film leads referenced 302 and 304. Shutter 306 is placed proximate to the focal plane 200 of the camera 300 (approximately 2.5 mm, in the example). The front portion of glass cover 106 protrudes through an opening in the camera body 300. If the opening in the camera body 300 is exactly 24 mm×36 mm, the front portion of glass cover 106 is reduced by chamfering, or similar, to fit.

The leading edges 108 and 110 of cover 106 are in contact with film leads 302 and 304. This ensures the correct positioning of the imaging device 100 along its optical axis 308.

In a typical example, the total thickness of glass cover 106 is approximately 2.1 mm, and the thickness of edges 108 and 110 is approximately 0.7 mm. The front end of glass cover 106 penetrates approximately 1.4 mm from focal plane 200 towards shutter 306, leaving a distance of approximately 1.1 mm between the shutter 306 and the glass cover 106.

Figure 4:
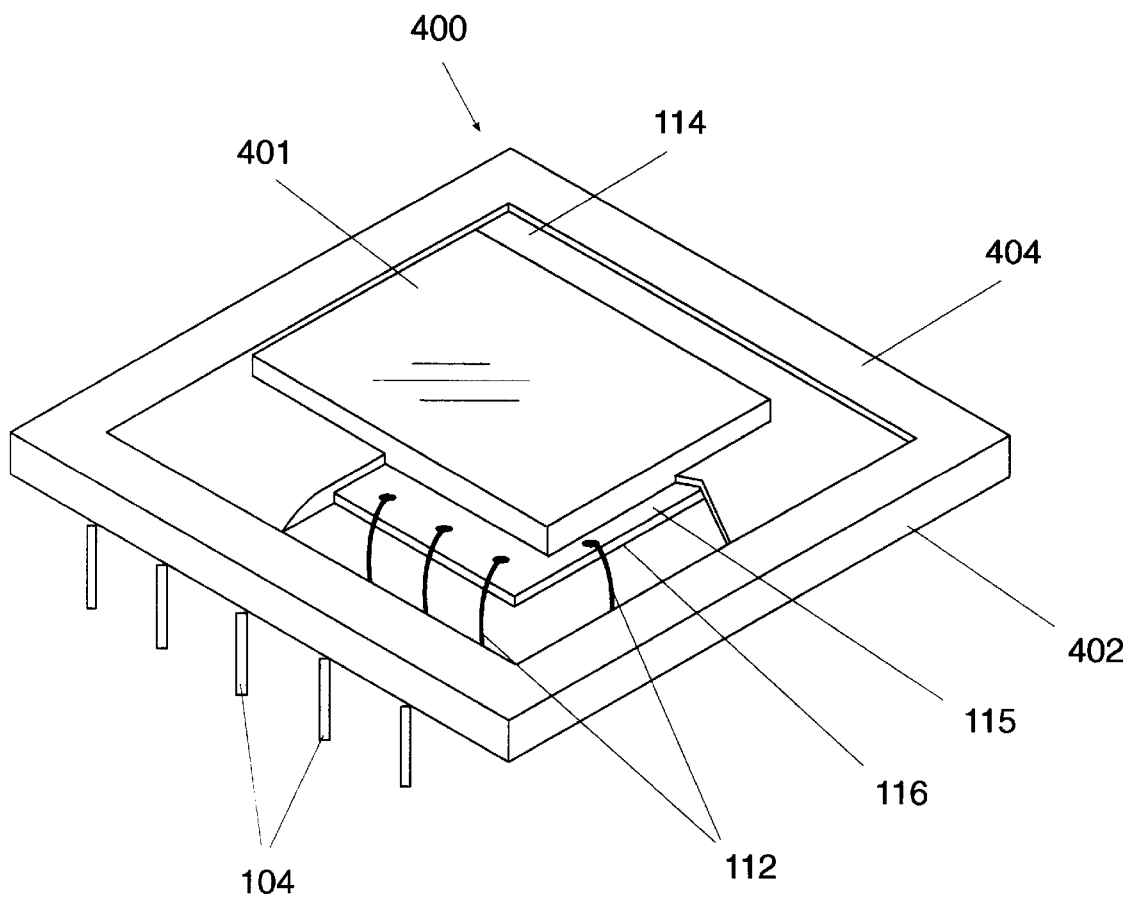
FIG. 4. is a general schematic view of a imaging device, constructed and operative in accordance with a further preferred embodiment of the invention.

A further, embodiment of a imaging device, generally designated 400 is illustrated in FIG. 4, to which reference is now made. imaging device 400 is similar to Imaging device 100, described hereinabove with respect to FIGS. 1–3. Elements of this embodiment of the invention which are similar to elements which have been previously described with respect to the preferred embodiment hereinabove, are similarly designated and will not be further described.

Imaging device 400 comprises a glass cover 401. Glass cover 401, which replaces glass cover 106 (FIGS. 1–3), is designed in the shape of a box and is generally more simple to manufacture. Part of protective layer 114 is shown removed in order to show the die 116 and connecting wires 112.

Support element 402, which performs the same function as support element 102 (of FIG. 1), comprises a rectangular box-like structure having a projecting upstand 404 around its perimeter. The upstand 404 acts as the reference plane to position the imaging device 400, in a manner similar to the leading edges 108 and 110 of support element 102 of FIG. 1. Support element 402 extends above die surface 115 (of die 116) by an amount equal to approximately ⅓ of the thickness of glass cover 401. The exact amount depends on the index of refraction of the glass cover 401.

When mounted onto a camera body, such as camera body 300 of FIG. 3, the upstand 404 is placed, in contact with film leads 302 and 304, in order to set the image device imaging device 400 in the correct position with reference to optical axis 308.

In this embodiment, wires 112 may be positioned along any of the four edges of the die, as shown.

In yet another embodiment of the invention, wires 112 are removed from the front side of the die, 116. This allow a thinner glass cover to be used, thus increasing the distance between the front of the glass cover and camera shutter 306. It enables the device of the present invention to be designed for camera bodies having a shutter that is nearer the focal plane of the camera.

Reference is now made to FIGS. 5A and 5B, which are cross sectional details of an imaging device, generally designated 500. FIG. 5B is an enlarged detail illustrating the method of connection of the wires 112 to the die 116 to the rear side of die 116.

Imaging device 500 is similar to CCD imaging device 400, described hereinabove with respect to FIG. 4. Elements of this embodiment of the invention which are similar to elements which have been previously described with respect to the preferred embodiment hereinabove, are similarly designated and will not be further described. A hole 506 is formed in the semiconductor die 116 using any well known silicon etching technique, such as the technique mentioned in the article "Ink Jet Printing Nozzle Arrays Etched in Silicon" by E. Bassous et al, App. Phys. Let, 31(2), 135, 1977. The top and lower surfaces 508 and 509, respectively, adjacent to hole 506 are also etched. An oxidization layer of silicon-dioxide is coated on to the inner faces of hole 506 and surfaces 508 and 509, to provide electrical isolation. A conducting material, such as aluminum, is deposited in the shape of a conducting band, on top and lower surfaces 508 and 509, respectively, and inside hole 506 to form a bonding pad 512, on the rear side of the die 116, for wire 112. An opening 514 is formed in support element 402 to enable the bonding machine to bond wire 112 to bonding pad 512, a process that is done from one direction, as is in conventional bonding machines.

In this embodiment, wires 112 can be positioned along any of the four edges of the die, as shown.

Surface 115, which is not protected by glass cover 401, is coated with a thin layer of any suitable isolating material for protection. Hole 514 can be filled with protecting material 114 from the rear side of the die for wire protection.

Figure 6:
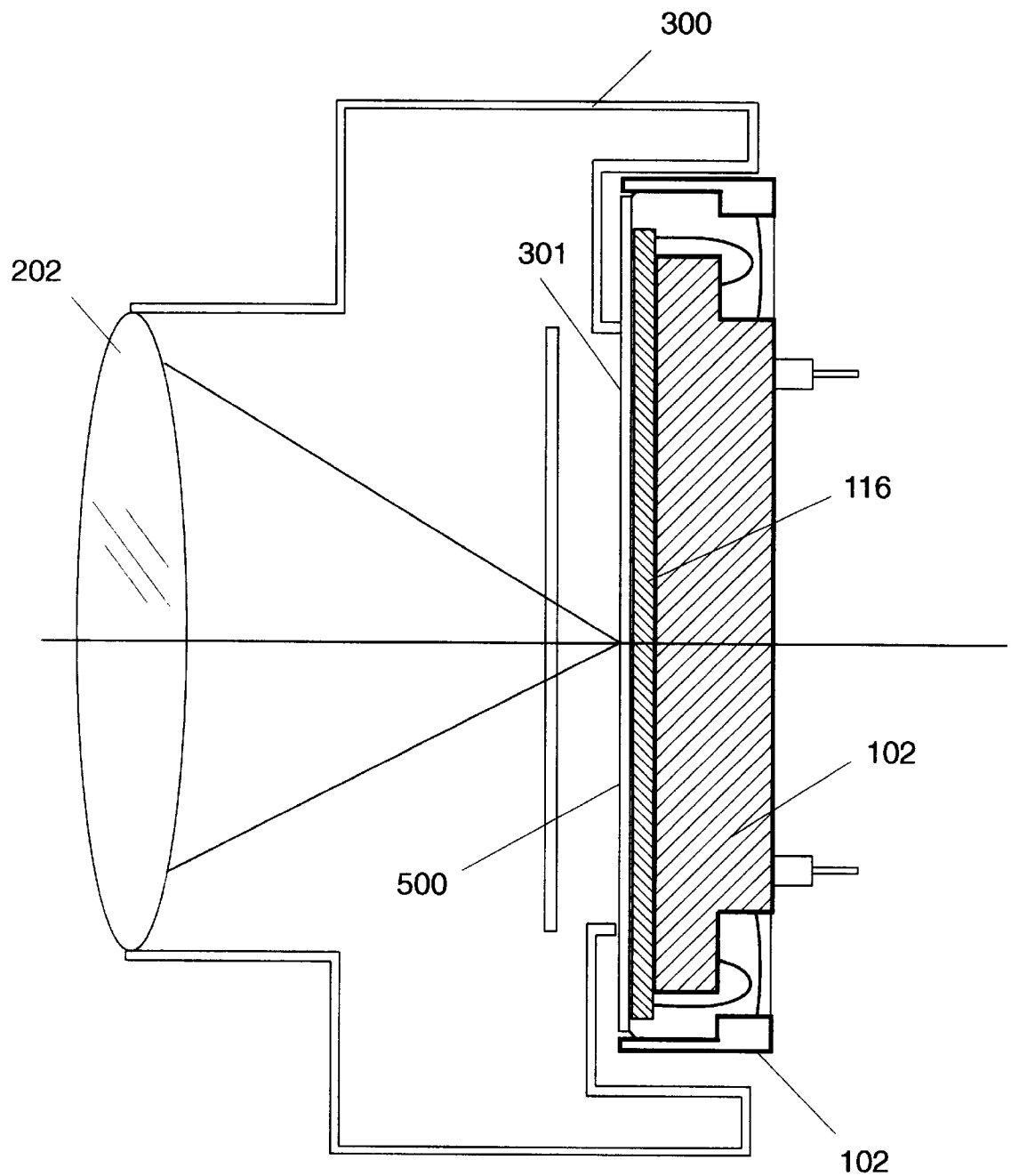
FIG. 6 is a schematic illustration of the imaging device of FIGS. 5A and 5B, attached to a camera body.

This embodiment enables the application of 0.1–1 mm glass cover 401 part or all of the surface area 115 of die 116. As such, the apparatus may be placed directly onto the film leads, without inserting part of the glass cover 401 into the camera body opening. The effective position of the sensitive area will be approximately ⅔ mm away from the desired position. This results in a relatively small limitation on focusing to infinity when using a camera body which is not designed to compensate for this. For example, using a conventional 35 mm camera body with 55 mm lens such as Micro-NIKKOR of Nikon, Japan, and 1 mm glass cover the effective range of nominal focusing is reduced to 4.5 m. By using F-stop 22, all ranges, including infinity are accessible this limitation becomes negligible when using 0.1 m glass cover. FIG. 6 is a schematic illustration of CCD imaging device 500, attached to a camera body 300.

Figure 7:
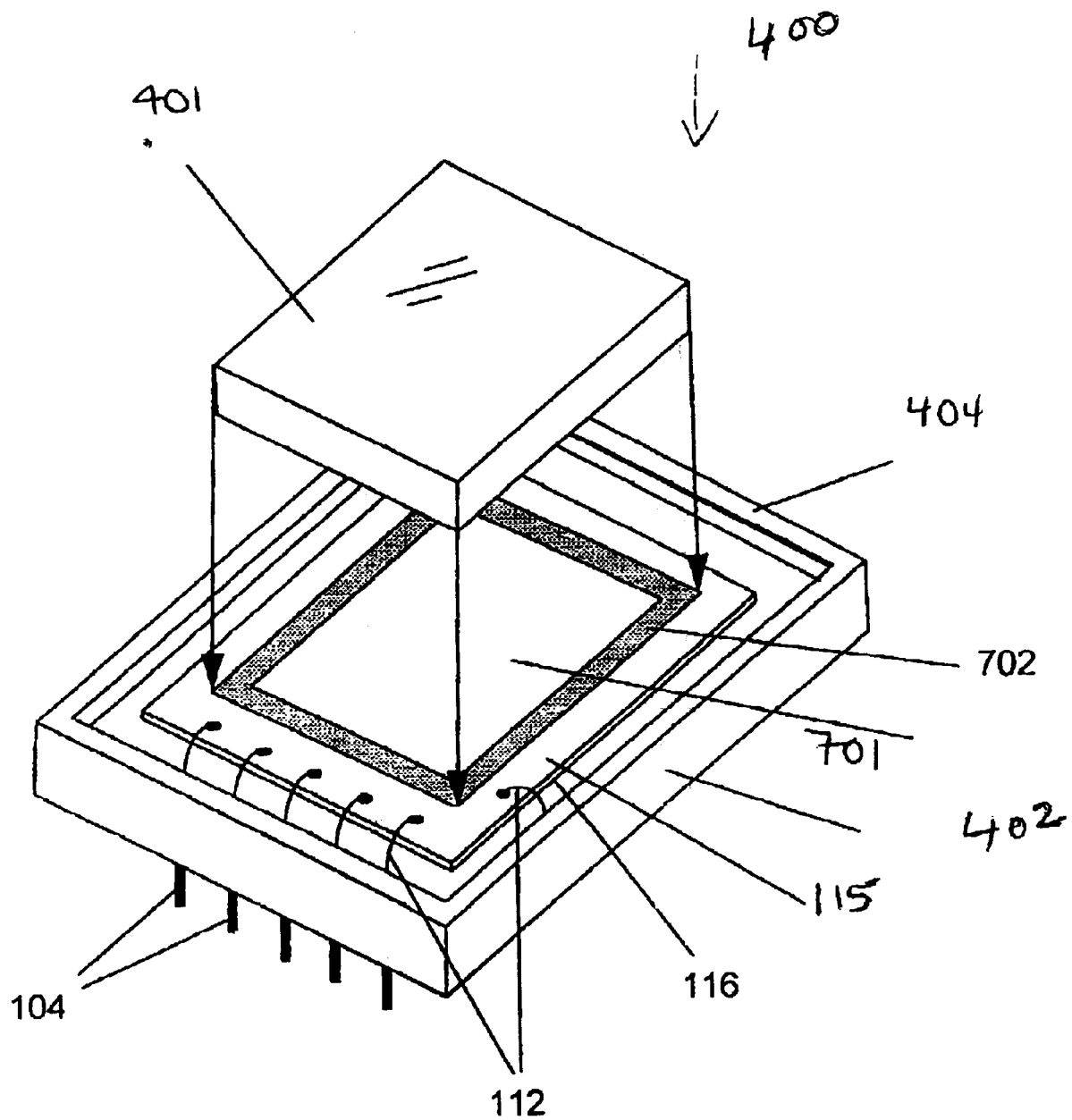
FIG. 7 is a schematic illustration of an imaging device in accordance with a further preferred embodiment of the invention.

An alternative embodiment of the invention is described with reference to FIG. 7. The embodiment of FIG. 7 is similar to the embodiment described hereinabove with respect to FIG. 4. The glass cover 401 is shown raised above the die 116 for clarity.

Deposition of glue over the whole area of the glass cover 401 may be problematic since the glue may induce damage to the color dyes deposited over the imaging area, referenced 700. One possible solution is to place the glue only along the perimeter, (shown by shading 702) of the glass cover 401, that is outside the sensitive area 701 containing the dyes. The application of the glue may be carried out by printing or any other suitable technique. The glue may be placed on the glass cover 401 or the sensitive area 701

Preferably, the glass cover 401 is then placed on top of the die, 116, and placed in a vacuum chamber. By applying vacuum, the glass cover 401 becomes pressed against the sensitive area 701 of die 116. At the same time, the glue is prevented from spreading to the area covered by the dyes. Any excess glue is removed.

It is appreciated that this technique is not limited to the mechanical design of the imaging device 400 as shown in FIG. 7.

It will be appreciated that although the hereinabove description refer to 35 mm photographic systems, the invention is applicable to other systems such as APS (Advanced Photo System), 6×6 and 6×7 formats, for example.

It will also be appreciated that the embodiments described hereinabove are provided as examples and that the scope of the invention is not limited by this description Rather, the scope of the invention is defined only by the claims hereinbelow.

It will be appreciated that the front die surface also refers to a color (with dye) sensor.

What is claimed is:

1. An imaging device for fitting into a standard camera body, said camera body including a lens and said body including a volume intermediate a shutter and a rear wall, said volume including a substantially rectangular shaped opening intermediate oppositely disposed film leads, said opening including a focal plane and an optical axis extending through said lens and said opening, said device comprising:

a support element;

an imaging die mounted on said support element, said die including an upper and a lower surface, and said die sized to at least partially cover the area of said opening;

a glass cover attached directly to the upper surface of said die, said glass cover of a single piece construction, substantially rectangular in shape and configured for covering the area of said opening, said glass cover including at least a pair of oppositely disposed substantially coplanar first portions configured for extending at least along said respective oppositely disposed film leads and for resting on said respective oppositely disposed film leads, and a second portion intermediate said first portions, said second portion extending beyond the plane defined by said substantially coplanar first portions, and configured for fitting into said opening, said second portion of a thickness for shifting said focal plane to said imaging die; and said die and said glass cover arranged to be in alignment with said opening along said optical axis.

* * * * *